United States Patent
Hatano

(10) Patent No.: US 6,197,433 B1
(45) Date of Patent: Mar. 6, 2001

(54) ROLLED COPPER FOIL FOR FLEXIBLE PRINTED CIRCUIT AND METHOD OF MANUFACTURING THE SAME

(75) Inventor: Takaaki Hatano, Samukawa-machi (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 0 days.

(21) Appl. No.: 09/481,673

(22) Filed: Jan. 12, 2000

(30) Foreign Application Priority Data

Jan. 18, 1999 (JP) ................................................. 11-009332

(51) Int. Cl.[7] ................................ C22C 9/00; C22F 1/08

(52) U.S. Cl. ...................... 428/606; 148/411; 148/412; 148/414; 148/432; 148/433; 148/435; 148/554; 148/681; 148/684; 420/469; 420/472; 420/473; 420/474; 420/487; 420/488; 420/491; 420/492; 420/494; 420/496; 420/497; 420/499; 420/500; 428/901

(58) Field of Search ................................. 428/606, 901; 148/411, 412, 414, 432, 433, 435, 554, 681, 684; 420/469, 472, 473, 474, 487, 488, 491, 492, 494, 496, 497, 499, 500

(56) References Cited

U.S. PATENT DOCUMENTS

| | | | |
|---|---|---|---|
| 5,004,520 | * | 4/1991 | Tsuji et al. ............................ 420/469 |
| 5,077,005 | * | 12/1991 | Kato ..................................... 420/474 |
| 6,093,499 | * | 7/2000 | Tomioka .............................. 420/469 |

* cited by examiner

*Primary Examiner*—Deborah Jones
*Assistant Examiner*—Robert R. Koehler
(74) *Attorney, Agent, or Firm*—Seidel, Gonda, Lavorgna & Monaco PC

(57) ABSTRACT

A rolled copper foil for flexible printed circuits contains not more than 10 ppm by weight of oxygen and has a softening-temperature rise index T defined as $T=0.60[Bi]+0.55[Pb]+0.60[Sb]+0.64[Se]+1.36[S]+0.32[As]+0.09[Fe]+0.02[Ni]+0.76[Te]+0.48[Sn]+0.16[Ag]+1.24[P]$ (each symbol in the brackets representing the concentration in ppm by weight of the element) in the range of 4 to 34. The concentrations of the elements are in the ranges of $[Bi]<5$, $[Pb]<10$, $[Sb]<5$, $[Se]<5$, $[S]<15$, $[As]<5$, $[Fe]<20$, $[Ni]<20$, $[Te]<5$, $[Sn]<20$, $[Ag]<50$, and $[P]<15$ (each symbol in the brackets representing the concentration in ppm by weight of the element). The foil has a thickness in the range of 5 to 50 $\mu$m and a half-softening temperature of 120 to 150° C., is capable of continuously retaining a tensile strength of at least 300 N/mm$^2$ at 30° C., and possesses excellent flex property and adequate softening property.

5 Claims, 1 Drawing Sheet

ROLLED COPPER FOIL FOR FLEXIBLE PRINTED CIRCUIT AND METHOD OF MANUFACTURING THE SAME

BACKGROUND OF THE INVENTION

Field of the invention

This invention relates to flexible wiring members such as flexible printed circuits (hereinafter called "FPCs") having excellent flex performance with ease of fabrication.

Printed wiring boards based on organic substrate are roughly divided into two types; rigid type with a rigid, copper-clad laminate consisting of glass-epoxy and paper-phenol substrates and flexible type with a flexible, copper-clad laminate consisting of polyimide and polyester substrates. Copper foil is mainly employed as conductive material for the printed wiring boards. The foil products are classified into electrodeposited and rolled foils depending on the manufacturing processes used.

Of the printed wiring boards, those for flexible printed circuits (FPCs) are fabricated by laminating a copper foil to a resin substrate and joining the layers with adhesive or with the application of heat and pressure into an integral board. In recent years, multilayer boards known as built-up boards have come into extensive use as effective means for high-density packaging or mounting. The copper foil that is used to form components for FPCs is, for the most part, rolled copper foil.

FPCs are largely used in printer heads, hard disk drives, and other components where wiring or conductive connections to movable parts are required. They are subjected to more than a million times of repetitive bending in service. With the recent tendency toward miniaturization and higher performance levels of devices, the requirement for the flex performance is becoming severer than heretofore.

The material for copper foil to be used in FPCs is mostly tough-pitch copper (containing 100–500 ppm oxygen). The foil is manufactured by hot rolling an ingot of such material and then repeating cold rolling and annealing alternately until a predetermined thickness is achieved. The rolled copper foil is then plated for surface roughing for enhanced adhesion to a resin substrate. Following the roughing plating, the copper foil is cut into pieces and each piece is laminated to a resin substrate. To join the copper foil and resin together, an adhesive of thermosetting resin, e.g., epoxy, is used. The adhesive is hardened by heating at 130 to 170° C. for several hours to several days. Thereafter the copper foil is etched to form various wiring or conductive patterns.

The flex property of a copper foil is markedly improved by recrystallization annealing over that of the foil as rolled. Therefore, the foil is used in the annealed state as an FPC component. The annealing is done either by heat treatment after the roughing plating and cutting into a size or by utilizing the heating at the time of joining to the resin substrate. The reason for which the annealing is performed during the course of fabrication rather than using an annealed copper foil from the beginning is that, when the copper foil is soft after annealing, it can be deformed or wrinkled upon cutting and laminating to the resin substrate, and a foil hard as rolled is preferred because of the ease of fabrication into an FPC.

For enhanced flex performance of an FPC, improving the flex fatigue property of a rolled copper foil as the starting material is beneficial. The flex fatigue property of an annealed copper foil is improved with the development of its cube texture. In order to help develop the cube texture, it is effective in the copper foil manufacturing process to increase the final rolling reduction ratio and decrease the grain diameter with the annealing immediately before the final rolling (Japanese Patent Application No. 10-101858).

Actually, however, a copper foil manufactured by such a process shows a sharp drop of the softening temperature due to an increase in the plastic strain accumulated by rolling. In extreme cases the foil, even stored at room temperature, can soften after a long period of storage (refer, e.g., to Japanese Patent Application Kokai No. 10-230303).

As noted already, a softened copper foil, if used in the fabrication of an FPC, can cause troubles such as foil deformation and seriously affect the ease of FPC fabrication. For these reasons it is necessary, when the above manufacturing process is adopted to obtain a copper foil with improved flex property, to heighten the softening temperature of the copper foil to a proper level.

SUMMARY OF THE INVENTION

The object of the present invention is to provide a rolled copper foil for FPCs which combines excellent flex property with adequate softening property, by appropriately elevating the softening temperature of a high-flexing rolled copper foil to eliminate the troubles that can otherwise result from its softening during storage.

The present invention settles the problems of the prior art and concerns the following:

(1) A rolled copper foil for flexible printed circuits characterized in that it contains not more than 10 parts per million by weight of oxygen, has a softening-temperature rise index T defined as T=0.60[Bi]+0.55[Pb]+0.60[Sb]+0.64[Se]+1.36[S]+0.09[Fe]+0.02[Ni]+0.76[Te]+0.48[Sn]+0.16[Ag]+1.24[P] (each symbol in the brackets representing the concentration in ppm by weight of the element) in the range of 4 to 34, the concentrations of the elements being in the ranges of [Bi]<5, [Pb]<10, [Sb]<5, [Se]<5, [S]<15, [As]<5, [Fe]<20, [Ni]<20, [Te]<5, [Sn]<20, [Ag]<50, and [P]<15 (each symbol in the brackets representing the concentration in ppm by weight of the element), and the foil has a thickness in the range of 5 to 50 $\mu$m, a half-softening temperature of 120 to 150° C., is capable of continuously retaining a tensile strength of at least 300 N/mm$^2$ at 30° C., and possesses excellent flex property and adequate softening property.

(2) A rolled copper foil for flexible printed circuits according to (1) above, characterized in that the total amount of one or more of the components Ti, Zr, Hf, V, Ta, B, Ca, and Nb is not more than 20 ppm by weight.

(3) A rolled copper foil for flexible printed circuits according to (1) or (2) above, characterized in that the intensity (I) of the (200) plane determined by X-ray diffraction of the rolled surface after annealing at 200° C. for 30 minutes, with respect to the X-ray diffraction intensity ($I_0$) of the (200) plane of fine copper powder, is $I/I_0>20.0$.

(4) A method of manufacturing the rolled copper foil for flexible printed circuits according to (1), (2), or (3) above characterized by a process which comprises hot rolling an ingot, repeating cold rolling and annealing alternately, and finally cold rolling the work to a foil, the annealing immediately preceding the final cold rolling being performed under conditions that enable the annealed recrystallized grains to have a mean grain diameter of not greater than 20 $\mu$m, the reduction ratio of the final cold rolling being beyond 90.0%, whereby excellent flex property and adequate softening property are achieved.

DETAILED DESCRIPTION OF THE INVENTION

When a copper foil is made by a process which involves a high reduction ratio or formation of fine grains to produce a developed cube texture, its flex fatigue property is improved but its softening temperature becomes too low. However, judicious control of the constituents in the material to raise the softening temperature will enable the resulting copper foil to have an adequate softening temperature.

The expression "adequate softening temperature" as used herein may be defined by two conditions:

(1) While the tensile strength of an as-rolled copper foil is in the range of 400–500 N/mm$^2$, the foil should retain a tensile strength of not less than 300 N/mm$^2$ after standing at 30° C. for one year.

(2) The copper foil should soften upon heat treatment either after roughing plating and cutting into a size or at the time of adhering to a resin substrate.

The temperature corresponds to the range of 120–150° C. in terms of the half-softening temperature obtained by annealing for 30 minutes (the annealing temperature at the point where the tensile strength is intermediate between that before the annealing and that after complete softening).

As sheet stock for rolled copper foil for FPCs, tough-pitch copper has hitherto been used in preference to oxygen-free copper. The reason is that oxygen-free copper, with a softening temperature higher than that of tough-pitch copper by more than 30° C., will not soften with the heat of treatment for its adhesion to a resin substrate. (Refer, e.g., to S. Sakai, Y. Nagai, K. Sugaya, and N. Otani: "Properties and Applications of Low-Temperature-Softening Oxygen-free Copper," *Hitachi Cable*, No.8 (1989), pp.51–56; and T. Eguchi, S. Fujita, Y. Miyatake, S. Chigusa, A. Tokunaga, M. Satoh, and T. Inada: "Developments of Low-Temperature-Softening, High-Flex Performance Oxygen-free Copper," *Furukawa Electric Journal*, No.86 (1990), pp.25–31.)

It thus follows that if oxygen-free copper that has not been deemed suitable as a stock for rolled copper foil for FPCs is made into a foil by a process which involves a sufficiently high reduction ratio or fine grain formation to produce excellent flex property, it would be possible to obtain a copper foil with a low enough softening temperature for use in FPCs.

Thus various proposals have been made to utilize oxygen-free copper as a material for rolled copper foils for FPCs. Most of them depend on trace additions of alloying elements for the drop of the softening temperature of oxygen-free copper to the level of tough-pitch copper. For example, one approach uses an oxygen-free copper whose softening temperature has been decreased by the addition of 10 to 600 ppm of boron (Japanese Patent No. 1582981). Another method uses an oxygen-free copper with a softening temperature lowered by the addition of 10 to 300 ppm of one or more of Ca, Zr, and misch metals (Japanese Patent No. 1849316).

Still another method adopts a special manufacturing process which lowers the softening temperature of oxygen-free copper to a level suitable for FPCs without resorting to the control of trace constituents. However, it requires final annealing at low temperature for a long period, at a sacrifice of copper foil production efficiency (Japanese Patent Application Kokai No. 1-212739). In any case the past attempts have been solely aimed at a decrease in the softening temperature of oxygen-free copper; none of them has ever positively taken the advantage of the high softening temperature inherent to oxygen-free copper.

Impurity elements contained in relatively high concentrations in oxygen-free copper and which influence the softening temperature of the copper are Bi, Pb, Sb, Se, S, As, Fe, Ni, Te, Ag, Sn, and P. The softening temperature rises as the concentrations of these elements increase. However, the concentrations of the elements in oxygen-free copper vary depending on the chance of manufacture or fluctuations in manufacture conditions, and the usual level of the variations does not allow the half-softening temperature of the copper to be confined within the narrow range of 120 to 150° C. In order to achieve it, the concentrations of the elements must be adjusted within proper ranges.

The main material used in preparing oxygen-free copper is electrolytic copper. That is, the electrolytic copper is melted and then cast to the oxygen-free copper. The electrolytic copper includes, of the elements mentioned above, Bi, Pb, Sb, Se, S, As, Ni, Te, Ag, and Sn. For the reason, the oxygen-free copper also includes, as impurities, Bi, Pb, Sb, Se, S, As, Ni, Te, Ag, and Sn which are mostly carried in from the electrolytic copper. The concentrations of these impurities, in the oxygen-free copper, therefore, can be adjusted by choosing an electrolytic copper material to be used in consideration of its impurity contents.

Following the melt-refining, the electrolytic copper is subjected to deoxidation by carbon, etc. for the adjustment of its oxygen concentration to be oxygen-free copper. During this stage Fe primarily finds its way as iron rust or the like into the copper. Controlling the Fe intrusion permits the adjustment of the Fe concentration in the product. Also, in the course of manufacture, a trace amount of P is sometimes added for deoxidation. The P concentration can then be adjusted by controlling the P addition.

On the other hand, Ti, Zr, Hf, V, Ta, B, Nb and the like are known to lower the softening temperature of copper when they are added in low concentrations. The phenomenon occurs presumably because these elements combine with the above impurity elements to transform the impurities from the state of solid solution to precipitation or because they serve as nuclei for recrystallization to reduce the energy of recrystallization (cf. Japanese Patent Application Kokai No. 63-140052).

These elements are contained in such slight amounts in electrolytic copper that, unless they are intentionally added during the course of manufacture of oxygen-free copper, they are seldom present in the copper in concentrations large enough to achieve an effect of lowering the softening temperature. Thus it is important not to use an electrolytic copper containing such elements, and it is particularly important to avoid the addition of such elements as a deoxidant or the like during the manufacture of oxygen-free copper.

The present inventors have repeated experiments with the foregoing in view, and it has now been found possible through precise control of the trace impurities in oxygen-free copper and through strict control of the manufacturing process to obtain a product with excellent flex property and a half-softening temperature adjusted within the range of 120 to 150° C.

The grounds on which various limitations are specified for the rolled copper foil according to the invention will be explained below.

Under the invention the rolled copper foil is intended to retain a tensile strength of not less than 300 N/mm$^2$ continuously at room temperature. More desirably the foil is to possess a tensile strength of not less than 300 N/mm$^2$ even after storage for one year at 30° C.

Here 30° C. corresponds to a temperature above the average annual temperature in Japan. The expression "continuously" used for the storage period before the copper foil is fabricated into FPCs means that the foil is usually stored continuously, though for one year at the most. With a tensile strength of 300 N/mm² or more, the copper foil will not wrinkle or have other trouble during fabrication. There is practically no problem, therefore, when the copper foil is capable of retaining a tensile strength of not less than 300 N/mm² when allowed to stand at 30° C. for one year. Such softening property corresponds, in terms of the half-softening temperature obtained by annealing for 30 minutes, to a temperature of 120° C. or upwards.

However, when the half-softening temperature obtained by 30-minute annealing exceeds 150° C., the copper foil is sometimes not softened by the heat treatment either after the roughing plating and cutting into a size orate the time of adhering to the resin substrate. That is why the half-softening temperature by 30-minute annealing is specified to be in the range of 120–150° C.

In order that the resulting FPC may have enhanced flex fatigue property, the copper foil must have enhanced flex fatigue property itself. The copper foil is incorporated in a recrystallized state in the FPC, and if the cube texture as a recrystallization texture of pure Cu is allowed to develop, the copper foil attains improved flex fatigue property.

The degree of development of the cube texture that produces satisfactory flex fatigue property is specified to be such that the intensity of the (200) plane determined by X-ray diffraction of the rolled surface is to be $I/I_0 > 20$, preferably $I/I_0 > 40.0$, with respect to the X-ray diffraction intensity ($I_0$) of the (200) plane of fine copper powder. Here the annealingat200° C. for 30 minutes is conducted to recrystallize the copper foil for the measurement of its X-ray diffraction intensity.

The reason for which the O content is specified to be not more than 10 ppm by weight is that it helps attain a softening temperature of 120° C. or upwards. If the O concentration exceeds 10 wt.ppm, the process that otherwise produces a foil with high flex performance will not allow the foil to have a half-softening temperature above 120° C., even though the amounts of trace constituents are adjusted within the ranges to be defined below. In contrast with this, decreasing the O concentration is accompanied with decreases in CuO inclusions, which bring an effect of improving the flex performance.

Bi, Pb, Sb, Se, S, As, Fe, Ni, Te, Ag, Sn, and P are elements that determine the softening property of oxygen-free copper. By adjusting their concentrations the half-softening temperature of the copper can be controlled. Actually, these elements vary in their rates of contribution to the rise of softening temperature, and the contributions of the individual elements must be weighted accordingly. With this in view, the index of softening-temperature rise (T) was defined as follows: T=0.60[Bi]+0.55[Pb]+0.60[Sb]+0.64 [Se]+1.36[S]+0.32[As]+0.09[Fe]+0.02[Ni]+0.76[Te]+0.48 [Sn]+0.16[Ag]+1.24[P] (each symbol in the brackets representing the concentration in ppm by weight of the element).

Here the coefficient of each element represents the linear inclination (° C./wt.ppm) obtained by finding the relation between the concentrations of the element added alone in varied amounts to high-purity Cu and the half-softening temperature and by rearranging the relation in a linear function. It has been confirmed that the individual elements achieve the effects of raising the half-softening temperature additionally.

When the concentrations of the elements are adjusted so that T comes in the range of 4 to 34, it is possible to confine the half-softening temperature of the copper foil made by a process that imparts high flex performance within the range of 120 to 150° C. If T is less than 4 the half-softening temperature will be below 120° C. and, conversely if T is more than 34, the half-softening temperature will be above 150° C.

In order to bring T within the range of 4 to 34 it is only necessary as noted above to adjust the amounts of contaminating impurities. An alternative is to add those elements deliberately in the course of manufacture of oxygen-free copper. In either case adjustments are necessary to keep the concentrations of the individual elements within the specified ranges.

The adjustments are needed for the following reasons:

(1) Segregation of low-melting elements such as Bi, Pb, Se, S, and Sn along the grain boundaries of an oxygen-free copper ingot would induce cracking during hot rolling.

(2) Nonmetallic elements such as S, Sb, Se, As, Te, and P would form nonmetallic inclusions between themselves and Cu and deteriorate mechanical properties including flex performance.

(3) Ag and the like are so expensive that copious addition of such elements in adjusting the softening temperature is not justified on grounds of cost.

(4) Increases in the concentrations of Fe, Ni, and the like tend to hamper the development of a recrystallization texture [decreasing the $I/I_0$ of the (200) plane], and thereby adversely affect the flex performance of the product.

For these reasons the concentration ranges of these elements that will not bring unfavorable effects are specified, in accordance with the present invention, to be:

[Bi]<5, [Pb]<10, [Sb]<5, [Se]<5, [S]<15, [As]<5, [Fe] <20, [Ni]<20, [Te]<5, [Ag]<50, [Sn]<20, and [P]<15 (each symbol in the brackets representing the concentration in ppm by weight of the element).

Presence of Ti, Zr, Hf, V, Ta, B, Ca, and Nb in copper lowers the half-softening temperature, but if the combined proportion of such elements is not more than 20 wt.ppm, the phenomenon of softening temperature drop will not occur. Hence the total amount of the elements is confined within the limit of 20 wt.ppm.

As for the thickness of a copper foil, the thinner the better the flex fatigue property because of the lower strains produced around the bend. If the foil is more than 50 μm thick, desired flex fatigue property will no longer be attained even when the cube texture is developed. Conversely if the thickness is less than 5 μm, the foil becomes difficult to handle since insufficient strength can lead to rupture or other failure. Hence the specified foil thickness range of 5–50 μm.

The copper foil according to the present invention is finished as such by cold rolling to a reduction ratio in excess of 90.0% following recrystallization annealing under conditions that produce a mean grain diameter of not greater than 20 μm. If the mean diameter upon the annealing that precedes the rolling is more than 20 μm or if the reduction ratio is less than 90.0%, then $I/I_0 < 20.0$ and no favorable flex fatigue property will be achieved. Also, the half-softening temperature may sometimes exceed 150° C. depending on the concentrations of trace constituents. The annealing before the final cold rolling may be combined with the hot rolling, in which case too the grain size as hot rolled is preferably adjusted to not greater than 20 μm.

DESCRIPTION OF THE PREFERRED EMBODIMENTS

Figure 1:
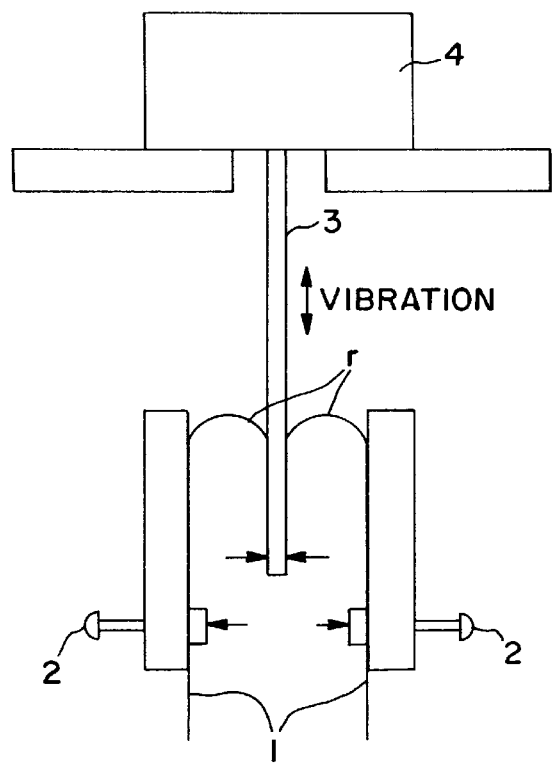
FIG. 1 is a schematic view of a flex tester used to determine the flex fatigue life of test foils.

The invention will be more fully described below in connection with examples thereof.

Copper ingots of the compositions shown in Table 1, each measuring 200 mm thick and 600 mm wide, were made and then hot rolled to a thickness of 10 mm each.

TABLE 1

| | No. | O (wt. ppm) | Bi | Pb | Sb | Se | S | As | Fe | Ni | Te | Sn | Ag | P | T | Ti | Zr | Hf | V | Ta | B | Ca | Nb |
|---|---|---|---|---|---|---|---|---|---|---|---|---|---|---|---|---|---|---|---|---|---|---|---|
| A | 1 | 2 | 0.1 | 2.3 | 1.0 | 0.2 | 5.4 | 0.4 | 2.9 | 6.4 | 0.2 | 2.3 | 16.6 | 7.4 | 23.0 | <1 | <1 | <1 | <1 | <1 | <1 | <1 | <8 |
| | 2 | 3 | <0.1 | <0.1 | 0.6 | <0.1 | 3.3 | 0.4 | 1.2 | 0.3 | <0.1 | 1.1 | 11.0 | 2.4 | 10.4 | <1 | <1 | <1 | <1 | <1 | <1 | <1 | <8 |
| | 3 | 2 | <0.1 | 0.2 | 0.2 | 0.3 | 5.6 | 0.6 | 8.1 | 7.2 | 0.1 | 2.1 | 14.0 | 4.3 | 17.8 | <1 | <1 | <1 | <1 | <1 | <1 | <1 | <8 |
| | 4 | 2 | <0.1 | <0.1 | 0.4 | <0.1 | 1.3 | 0.1 | 0.3 | 0.2 | <0.1 | 0.5 | 4.8 | 1.7 | 5.2 | <1 | <1 | <1 | <1 | <1 | <1 | <1 | <8 |
| | 5 | 3 | 0.2 | 4.8 | 0.7 | 0.1 | 12.2 | 0.2 | 4.6 | 3.1 | 0.3 | 5.4 | 12.8 | 6.5 | 33.3 | <1 | <1 | <1 | <1 | <1 | <1 | <1 | <8 |
| | 6 | 1 | <0.1 | <0.1 | 0.4 | <0.1 | 1.1 | 0.1 | 0.3 | 0.2 | <0.1 | 0.6 | 3.8 | 1.5 | 4.8 | <1 | <1 | <1 | <1 | <1 | <1 | <1 | <8 |
| | 7 | 1 | 0.5 | 5.5 | 1.4 | 0.3 | 3.7 | 0.2 | 6.8 | 5.0 | 0.2 | 4.4 | 18.7 | 3.1 | 19.3 | <1 | <1 | <1 | <1 | <1 | <1 | <1 | <8 |
| | 8 | 2 | 0.1 | 3.6 | 0.4 | 0.2 | 3.8 | 0.3 | 3.4 | 2.1 | 0.1 | 1.5 | 15.8 | 3.2 | 15.4 | <1 | <1 | <1 | <1 | <1 | <1 | <1 | <8 |
| | 9 | 4 | 0.2 | 5.5 | 0.9 | 0.2 | 11.5 | 1.1 | 1.6 | 1.3 | 0.2 | 2.4 | 9.9 | 5.7 | 30.1 | <1 | <1 | <1 | <1 | <1 | <1 | <1 | <8 |
| | 9 | 2 | <0.1 | 0.3 | 0.6 | 0.1 | 3.2 | 0.5 | 4.6 | 7.0 | 0.2 | 6.2 | 14.1 | 3.5 | 15.4 | <1 | <1 | <1 | <1 | <1 | <1 | <1 | <8 |
| | 10 | 2 | 2.3 | 6.2 | 3.3 | 0.1 | 4.6 | 0.3 | 3.8 | 2.6 | 0.1 | 2.1 | 12.8 | 3.7 | 21.3 | <1 | <1 | <1 | <1 | <1 | <1 | <1 | <8 |
| | 11 | 2 | <0.1 | 0.3 | 0.8 | 0.2 | 3.3 | 3.3 | 13.6 | 10.5 | 3.1 | 2.6 | 6.9 | 4.8 | 18.4 | <1 | <1 | <1 | <1 | <1 | <1 | <1 | <8 |
| | 12 | 3 | <0.1 | 0.2 | 0.4 | <0.1 | 2.6 | 0.5 | 8.3 | 13.5 | 0.1 | 16.2 | 42.5 | 3.3 | 23.8 | <1 | <1 | <1 | <1 | <1 | <1 | <1 | <8 |
| | 13 | 2 | 0.2 | 1.6 | 0.7 | 0.1 | 9.7 | 0.5 | 4.8 | 3.6 | 1.7 | 1.9 | 20.6 | 6.3 | 28.6 | <1 | <1 | <1 | <1 | <1 | <1 | <1 | <8 |
| | 14 | 8 | <0.1 | 2.3 | 0.5 | 3.7 | 0.7 | 0.2 | 7.6 | 1.0 | <0.1 | 6.5 | 9.7 | <0.1 | 10.3 | <1 | <1 | <1 | <1 | <1 | <1 | <1 | <8 |
| | 15 | 2 | 0.2 | 3.3 | 1.0 | 1.3 | 4.6 | 0.2 | 4.4 | 5.5 | <0.1 | 2.2 | 11.8 | 0.1 | 13.3 | <1 | <1 | <1 | <1 | <1 | <1 | <1 | <8 |
| | 16 | 3 | 0.1 | 2.6 | 0.9 | 0.3 | 4.5 | 0.1 | 2.6 | 1.4 | 0.1 | 2.7 | 10.6 | 3.3 | 15.8 | <1 | <1 | <1 | <1 | 10 | <1 | <1 | 10 |
| | 17 | 2 | <0.1 | 0.2 | 0.1 | 0.1 | 4.4 | 0.3 | 1.5 | 1.0 | <0.1 | 1.4 | 10.9 | 3.2 | 12.8 | <1 | <1 | <1 | <1 | <1 | 12 | 2 | 14 |
| | 18 | 5 | 0.2 | 0.1 | 0.3 | 0.1 | 8.9 | 0.2 | 2.8 | 0.2 | 0.1 | 0.3 | 4.2 | 2.5 | 16.8 | 10 | 7 | <1 | <1 | <1 | <1 | <1 | 18 |
| | 19 | 2 | 1.6 | 1.3 | 0.5 | 0.3 | 3.4 | 0.1 | 2.8 | 2.9 | 0.1 | 1.6 | 2.5 | 4.8 | 14.1 | <1 | <1 | <1 | <1 | <1 | <1 | <1 | <8 |
| | 20 | 2 | 0.1 | 2.2 | 0.5 | 0.2 | 6.7 | 0.3 | 3.1 | 1.6 | 0.2 | 3.6 | 9.2 | 3.5 | 18.9 | <1 | <1 | <1 | <1 | <1 | <1 | <1 | <8 |
| B | 1 | 174 | 0.1 | 2.3 | 1.0 | 0.2 | 5.2 | 0.4 | 2.9 | 6.4 | 0.1 | 2.8 | 16.8 | 6.7 | 21.6 | <1 | <1 | <1 | <1 | <1 | <1 | <1 | <8 |
| | 2 | 2 | <0.1 | <0.1 | 0.4 | <0.1 | 0.7 | 0.1 | 1.0 | 2.3 | <0.1 | 0.5 | 5.6 | 0.4 | 3.0 | <1 | <1 | <1 | <1 | <1 | <1 | <1 | <8 |
| | 3 | 2 | <0.1 | 4.8 | 1.2 | 0.1 | 13.8 | 0.2 | 4.6 | 2.0 | 0.1 | 2.4 | 14.2 | 12.3 | 41.5 | <1 | <1 | <1 | <1 | <1 | <1 | <1 | <8 |
| | 4 | 2 | <0.1 | 0.2 | 0.1 | <0.1 | 17.5 | 0.1 | 3.2 | 0.2 | <0.1 | 0.7 | 4.1 | 1.2 | 26.8 | <1 | <1 | <1 | <1 | <1 | <1 | <1 | <8 |
| | 5 | 4 | 7.7 | 0.2 | 0.1 | 0.1 | 6.5 | 0.2 | 2.4 | 0.5 | 0.2 | 2.6 | 11 | 3.3 | 16.5 | <1 | <1 | <1 | <1 | <1 | <1 | <1 | <8 |
| | 6 | 3 | <0.1 | 1.6 | 0.2 | 0.1 | 5.3 | 0.1 | 49 | 2.7 | <0.1 | 3.6 | 14 | 4.4 | 22.2 | <1 | <1 | <1 | <1 | <1 | <1 | <1 | <8 |
| | 7 | 3 | 0.2 | 1.5 | 0.7 | <0.1 | 8.7 | 0.2 | 1.5 | 3.6 | 0.1 | 3.6 | 11.3 | 3.6 | 21.4 | <1 | <1 | <1 | <1 | 42 | <1 | <1 | 42 |
| | 8 | 1 | <0.1 | 4.6 | 0.3 | 0.1 | 10.4 | 0.1 | 2.6 | 3.8 | 0.3 | 3.6 | 16.0 | 7.7 | 31.3 | 13 | 12 | 14 | 12 | <1 | <1 | <1 | 51 |
| | 9 | 2 | <0.2 | 4.3 | 0.1 | 0.2 | 7.9 | 0.1 | 3.7 | 1.1 | 0.1 | 2.3 | 12.3 | 5.6 | 23.8 | <1 | <1 | <1 | <1 | 38 | <1 | 17 | 27 |
| | 10 | 6 | 0.1 | 2.5 | 0.3 | 0.2 | 11 | 0.1 | 4.4 | 2.7 | 0.3 | 2.6 | 19 | 8.3 | 31.4 | <1 | <1 | <1 | <1 | <1 | <1 | <1 | <8 |
| | 11 | 4 | 0.2 | 1.9 | 0.2 | 0.1 | 7.9 | 0.2 | 3.5 | 2.2 | <0.1 | 1.3 | 9.9 | 5.4 | 21.3 | <1 | <1 | <1 | <1 | <1 | <1 | <1 | <8 |
| | 12 | 2 | <0.1 | 0.6 | 0.1 | 0.1 | 6.6 | 0.1 | 4.6 | 1.3 | <0.1 | 2.3 | 12 | 4.3 | 18.2 | <1 | <1 | <1 | <1 | <1 | <1 | <1 | <8 |

A: Alloy of the invention
B: Comparative alloy

Here Comparative Example No. 1 represents an ordinary tough-pitch copper in use as a copper foil material for FPCS. Annealing and cold rolling were then repeated and sheets of $t_0$ mm thickness. as rolled were obtained. The sheets were annealed and recrystallized and, after the removal of oxide scale, they were cold rolled to a desired thickness of t mm. The reduction ratio R by the final cold rolling is given by $$R=(t_0-t)/t_0\times100(\%).$$

After the annealing before the final cold rolling, the annealed grain diameter was determined by counting the intercept of straight line at the grain boundary on the transverse cross section.

With test specimens of copper foils thus produced under varied process annealing conditions and at varied final rolling reduction ratios, their properties were evaluated as below.

(1) Cube texture

Each specimen was heated at 200° C. for 30 minutes, and the integrated value of intensity (I) of the (200) plane as determined by X-ray diffraction of the rolled surface was found. The value was divided by the predetermined integrated value of intensity ($I_0$) of the (200) plane of a fine copper powder to calculate the $I/I_0$. The integrated value of peak intensity was measured using a Co X-ray tube within the range of $2\theta=57\sim63°$ ($\theta$=diffraction angle).

(2) Flex fatigue property

Each specimen was heated at 200° C. for 30 minutes for recrystallization, and then its flex fatigue life was determined using a flex tester illustrated in FIG. 1. The tester comprises a vibration drive unit 4 and a vibration transmitting member 3 connected to the drive unit. A test foil 1 is fixed in place at a total of four points indicated by arrows; at the ends of screws 2 and at the lower end of the member 3. As the vibrating member 3 is driven up and down, intermediate portions of the foil 1 are bent like hairpins at a given radius of curvature r. In the test under review, the number of flex cycles to failure was counted by repeating the bending under the following conditions:

The width of test specimen=12.7 mm; length of specimen=200 mm; sampling direction=each specimen was cut off so that its length was parallel to the direction of rolling; radius of curvature r=2.5 mm; vibration stroke=25 mm; and vibration speed=1500 vibrations/min.

When the flex fatigue life exceeded 30,000 flex cycles, the specimen was deemed to have excellent flex fatigue property. The test was an accelerated test, conducted under conditions severer than when the FPCs are actually in service.

(3) Half-softening temperature

Test specimens were annealed for 30 minutes at varied temperatures and then tested for tensile strength. The annealing temperature at which the tensile strength value was intermediate between the as-rolled tensile strength and the tensile strength of the specimen completely softened by annealing at 300° C. for 30 minutes was determined. When a specimen showed a half-softening temperature in the range of 120–150° C. it was judged to possess adequate softening property.

(4) Softening behavior at room temperature

Test materials as rolled were stored in a thermostat kept at 30° C. They were tested for tensile strength monthly after the start of storage, and the periods in which their tensile strength values declined below 300 $N/mm^2$ were determined. The evaluation was performed up to a total period of 12 months.

Table 2 summarizes the histories of working and properties of the copper foils tested.

TABLE 2

| | | | Manufacturing process | | | | |
|---|---|---|---|---|---|---|---|
| | No. | Thickness ($\mu$m) | Grain dia. before rolling ($\mu$m) | Final roll. reduction ratio (%) | $I/I_0$ of the (200) plane of cube texture | No. of flex cycles (times) | Half-softeng temp. (° C.) | Period in which tens. str. at 30° C. drops below 300 $N/mm^2$ |
| B | 1 | 35 | 13 | 97.7 | 62.4 | 84900 | 138 | over 12 months |
| | 2 | 35 | 13 | 97.7 | 57.3 | 80500 | 124 | " |
| | 3 | 35 | 13 | 97.7 | 60.4 | 83700 | 135 | " |
| | 4 | 35 | 13 | 97.7 | 61.6 | 86900 | 122 | " |
| | 5 | 35 | 13 | 97.7 | 63.6 | 85900 | 148 | " |
| | 6 | 35 | 13 | 97.7 | 64.9 | 90100 | 121 | " |
| | 7 | 35 | 13 | 97.7 | 59.8 | 85000 | 135 | " |
| | 8 | 35 | 13 | 97.7 | 56.8 | 82900 | 130 | " |
| | 9 | 35 | 13 | 97.7 | 61.4 | 88600 | 143 | " |
| | 9 | 35 | 13 | 91.3 | 35.3 | 48700 | 136 | " |
| | 10 | 35 | 18 | 91.3 | 22.6 | 34800 | 147 | " |
| | 11 | 35 | 15 | 98.3 | 53.6 | 82900 | 131 | " |
| | 12 | 35 | 12 | 94.2 | 47.1 | 74800 | 140 | " |
| | 13 | 35 | 14 | 94.2 | 43.6 | 69900 | 146 | " |
| | 14 | 35 | 8 | 97.7 | 93.6 | 95500 | 122 | " |
| | 15 | 35 | 17 | 97.7 | 45.6 | 60900 | 134 | " |
| | 16 | 35 | 12 | 94.2 | 50.9 | 73400 | 133 | " |
| | 17 | 35 | 12 | 91.3 | 39.2 | 59800 | 132 | " |
| | 18 | 35 | 14 | 98.3 | 60.3 | 86800 | 129 | " |
| | 19 | 18 | 14 | 94.0 | 44.5 | 483400 | 132 | " |
| | 20 | 9 | 14 | 94.0 | 43.1 | 2061600 | 137 | " |
| A | 1 | 35 | 12 | 94.2 | 50.8 | 69500 | 103 | 5 months |
| | 2 | 35 | 13 | 97.7 | 57.9 | 84300 | 115 | 10 months |
| | 3 | 35 | 13 | 97.7 | 58.5 | 82600 | 156 | over 12 months |
| | 4 | 35 | 16 | 91.3 | 24.4 | 29000 | 149 | " |
| | 5 | Because of cracking on hot rolling, it could not be worked into a foil. | | | | | | |
| | 6 | 35 | 17 | 91.3 | 18.4 | 28700 | 147 | over 12 months |
| | 7 | 35 | 10 | 96.5 | 51.3 | 80200 | 97 | 3 months |
| | 8 | 35 | 13 | 96.5 | 48.6 | 76500 | 101 | 6 months |

TABLE 2-continued

| | | Manufacturing process | | | | | |
|---|---|---|---|---|---|---|---|
| No. | Thickness ($\mu$m) | Grain dia. before rolling ($\mu$m) | Final roll. reduction ratio (%) | $I/I_0$ of the (200) plane of cube texture | No. of flex cycles (times) | Half-softeng temp. (°C.) | Period in which tens. str. at 30°C. drops below 300 N/mm² |
| 9  | 35 | 13 | 96.5 | 49.0 | 77400 | 112 | 9 months |
| 10 | 35 | 25 | 94.2 | 15.4 | 24500 | 157 | over 12 months |
| 11 | 35 | 17 | 88.3 | 8.7  | 20600 | 155 | " |
| 12 | 70 | 13 | 97.7 | 61.9 | 14800 | 135 | " |

B: Alloy of the invention
B: Comparative alloy

The specimens of rolled copper foil according to the invention, Nos. 1 to 20, exhibited $I/I_0$ values of greater than 20.0 owing to the development of the cube texture by annealing. Consequently, they showed excellent flex fatigue life of more than 30,000 flex cycles. Their softening temperatures came within the target range of 120–150° C., and their tensile strength values after one-year storage at room temperature (30° C.) were still in excess of 300 N/mm².

On the other hand, the specimen of Comparative Example No. 1 which was a tough-pitch copper foil made by a process capable of imparting high flex performance, despite a T value in excess of 4, showed a half-softening temperature lower than 120° C. and, when stored at 30° C., its tensile strength value decreased to less than 300 N/mm² before the lapse of one year.

The specimen of Comparative Example No. 2, with a T value of less than 4, exhibited a half-softening temperature under 120° C. and a tensile strength drop during storage at 30° C. to less than 300 N/mm² within one year. Comparative Example No. 3, with a T value of more than 34, showed a half-softening temperature beyond 150° C., indicating a high possibility of failing to recrystallize during the course of FPC fabrication.

Comparative Example No. 5 contained Bi in a high concentration of more than 5 wt.ppm, and the ingot cracked in the course of hot rolling and could not be worked into a copper foil. Similarly, hot rolling cracking occurred when the Pb, Se, S, and Sn concentrations exceeded the individually specified ranges.

Comparative Example No. 4, with an S concentration of greater than 15 wt.ppm, cracked upon hot rolling. The cracks were machined off and the stock was worked into a foil 35 $\mu$m thick. However, the resulting foil failed to withstand a test for more than 30,000 flex cycles because of increased $Cu_2S$ inclusions, although its $I/I_0$ value was more than 20.0. The same applied when the Sb, Se, As, Te, and P concentrations were beyond the specified ranges; increased nonmetallic inclusions shortened the flex fatigue life.

In Comparative Example No. 6 a large Fe content of more than 20 wt.ppm inhibited the development of a recrystallization texture. The resulting foil, with an $I/I_0$ value of less than 20, failed to show a flex life of more than 30,000 flex cycles. Also, when the Ni concentration was larger than specified, the $I/I_0$ value was less than 20.

Comparative Example Nos. 7, 8, and 9 all gave T values of more than 4. However, because Ti, Zr, Hf, V, B, Ca, Nb, etc. were used as deoxidants and their total concentration was greater than 20 wt.ppm, the foils showed half-softening temperatures below 120° C. and, when stored at 30° C., their tensile strength values decreased to less than 300 N/mm² before the lapse of one year.

Comparative Example No. 10 had a pre-rolling grain diameter of over 20 $\mu$m and Comparative Example No. 11 had a rolling reduction ratio of less than 90%. The both specimens, therefore, had $I/I_0$ values on the (200) plane of less than 20 and short flex life of less than 30,000 flex cycles. Moreover, because the plastic strains built up by rolling are limited, their half-softening temperatures were in excess of 150° C.

Comparative Example No. 12 had a thickness greater than 50 $\mu$m and therefore, despite a developed cube texture, the number of flex cycles was less than 30,000.

Figure 2:
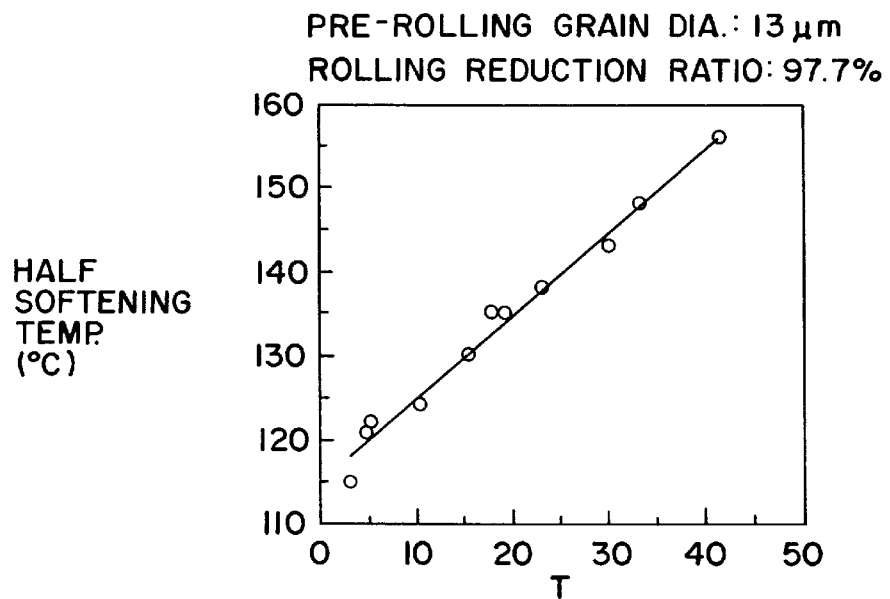
FIG. 2 is a graph showing the relation between T and half-softening temperature in Examples of the invention and Comparative Examples.

In FIG. 2 is graphically represented the relation between T and half-softening temperature of Example Nos. 1 to 9 of this invention and Comparative Example Nos. 2 and 3, all made by the same process. It can be seen that the greater the T value the higher the half-softening temperature and that the T in the range of 4 to 34 allows the target half-softening temperatures of 120–150° C. to be attained.

The rolled copper foil for flexible printed circuits according to the present invention possesses excellent flex fatigue property. It also has adequate half-softening temperature. Since it does not soften while in storage or upon annealing, the foil has desirable properties for fabrication into flexible printed circuits. Needless to say, the copper foil is suitable as well for non-FPC applications, such as electrodes of lithium ion secondary batteries.

What is claimed is:

1. A rolled copper foil for flexible printed circuits characterized in that it contains not more than 10 parts per million by weight of oxygen and has a softening-temperature rise index T defined as T=0.60[Bi]+0.55[Pb]+0.60[Sb]+0.64[Se]+1.36[S]+0.32[As]+0.09[Fe]+0.02[Ni]+0.76[Te]+0.48[Sn]0.16[Ag]+1.24[P] (each symbol in the brackets representing the concentration in ppm by weight of the element) in the range of 4 to 34, the concentrations of the elements being in the ranges of [Bi]<5, [Pb]<10, [Sb]<5, [Se]<5, [S]<15, [As]<5, [Fe]<20, [Ni]<20, [Te]<[Ag]<50, and [P]<15 (each symbol in the brackets representing the concentration in ppm by weight of the element), and the foil has a thickness in the range of 5 to 50 $\mu$m and a half-softening temperature of 120 to 150° C., is capable of continuously retaining a tensile strength of at least 300 N/mm² at 30° C., and possesses excellent flex property and adequate softening property.

2. A rolled copper foil according to claim 1, wherein the total amount of one or more of the components Ti, Zr, Hf, V, Ta, B, Ca, and Nb is not more than 20 ppm by weight.

3. A rolled copper foil according to claim 1, wherein the intensity (I) of the (200) plane determined by X-ray diffraction of the rolled surface after annealing at 200° C. for 30 minutes, with respect to the X-ray diffraction intensity ($I_0$) of the (200) plane of fine copper powder, is $I/I_0$>20.0.

4. A method of manufacturing the rolled copper foil for flexible printed circuits according to claim 1, which comprises hot rolling an ingot, repeating cold rolling and annealing alternately, and finally cold rolling the work to a foil, the annealing immediately preceding the final cold rolling being performed under conditions that enable the annealed recrystallized grains to have a mean grain diameter of not greater than 20 μm, the reduction ratio of the final cold rolling being beyond 90.0%, whereby excellent flex property and adequate softening property are achieved.

5. A rolled copper foil according to claim 2, wherein the intensity (I) of the (200) plane determined by X-ray diffraction of the rolled surface after annealing at 200° C. for 30 minutes, with respect to the X-ray diffraction intensity ($I_0$) of the (200) plane of fine copper powder, is $I/I_0 > 20.0$.

* * * * *